United States Patent
Duffner et al.

(10) Patent No.: US 8,937,846 B2
(45) Date of Patent: Jan. 20, 2015

(54) WRITE LEVEL TRAINING USING DUAL FREQUENCIES IN A DOUBLE DATA-RATE MEMORY DEVICE INTERFACE

(71) Applicant: Avago Technologies General IP (Singapore) Pte. Ltd., Singapore (SG)

(72) Inventors: Barbara Jean Duffner, Fort Collins, CO (US); David Linam, Fort Collins, CO (US)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 98 days.

(21) Appl. No.: 13/890,905

(22) Filed: May 9, 2013

(65) Prior Publication Data

US 2014/0334243 A1    Nov. 13, 2014

(51) Int. Cl.
  G11C 8/00    (2006.01)
  G11C 8/18    (2006.01)
  G11C 7/00    (2006.01)

(52) U.S. Cl.
  CPC ... G11C 8/18 (2013.01); G11C 7/00 (2013.01)
  USPC ............ 365/233.13; 365/233.11; 365/233.16; 365/233.19; 365/189.16

(58) Field of Classification Search
  CPC ....... G11C 7/1066; G11C 7/1072; G11C 7/22
  USPC ............. 365/233.13, 233.11, 233.16, 233.19, 365/189.16
  See application file for complete search history.

(56) References Cited

U.S. PATENT DOCUMENTS

| | | | |
|---|---|---|---|
| 7,463,547 B2 * | 12/2008 | Nakatsu et al. | 365/233.1 |
| 7,701,802 B2 | 4/2010 | Vergnes et al. | |
| 7,961,533 B2 | 6/2011 | Searles | |
| 8,238,175 B2 * | 8/2012 | Fujisawa | 365/193 |
| 8,386,737 B2 * | 2/2013 | Jeon et al. | 711/167 |

OTHER PUBLICATIONS

External Memory PHY Interface Megafunction User Guide (ALTMEMPHY) [online]. Altera Corporation, Nov. 2008 [retrieved on May 8, 2013]. Retrieved from the Internet: <http://application-notes.digchip.com/038/38-21537.pdf>.

4.5 Gb, DDR3, 64 M×72 Integrated Module (IMOD) [online]. Logic Devices Incorporated, Jul. 6, 2009 [retrieved on May 8, 2013]. Retrieved from the Internet: <http://pdf1.alldatasheet.com/datasheet-pdf/view/312278/LODEV/L9D345G72BG5.html>.

* cited by examiner

*Primary Examiner* — Son Dinh

(57) ABSTRACT

A write leveling calibration system and method for double data-rate dynamic random access memory includes performing write leveling at two different frequencies to determine to which of two successive rising clock cycle edges each data strobe signal would be aligned as a result of applying the write leveling delay determined by the write-leveling procedure. The determination can then be used to ensure that the data strobe signals of all source synchronous groups are aligned with the same edge of the clock signal.

20 Claims, 5 Drawing Sheets

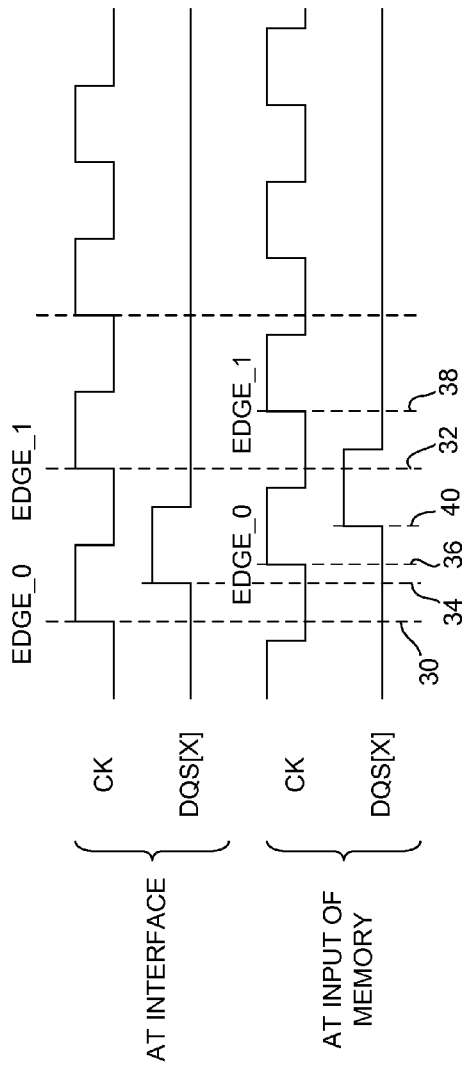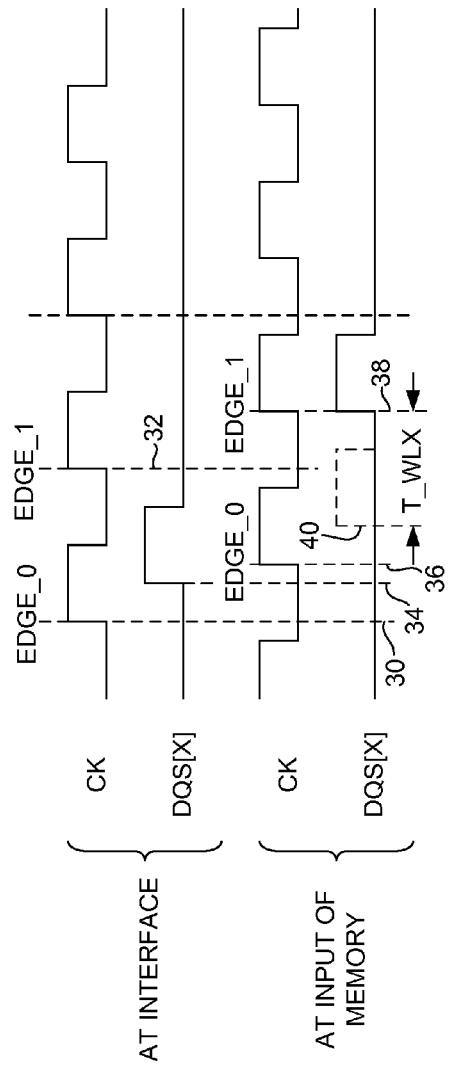

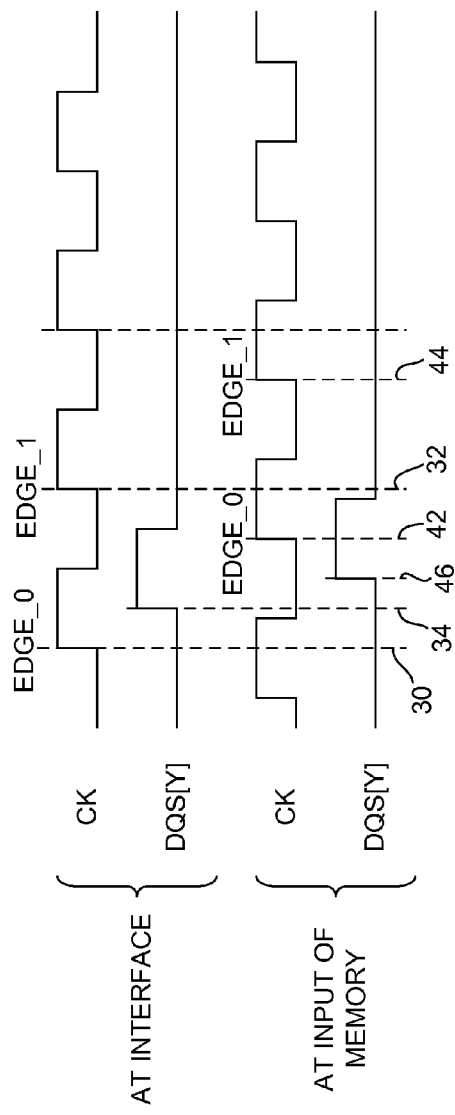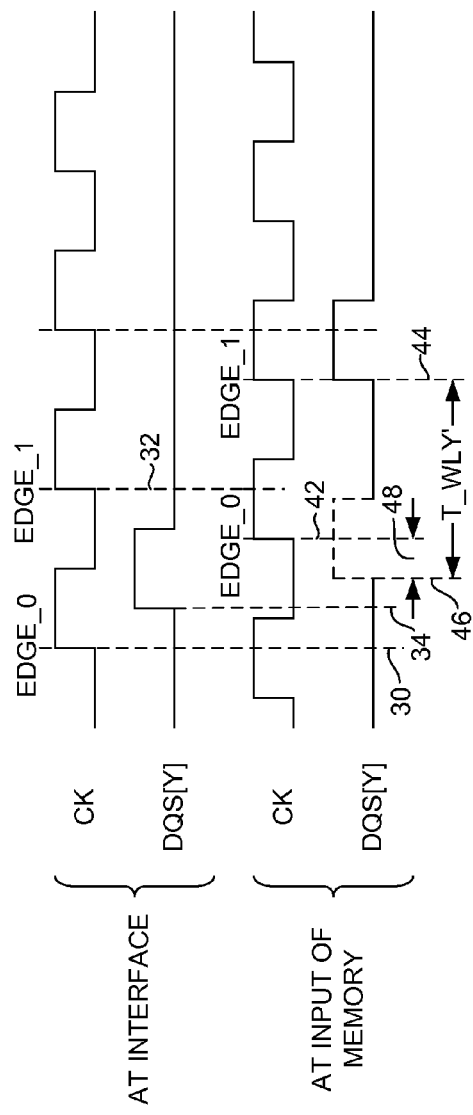

WRITE LEVEL TRAINING USING DUAL FREQUENCIES IN A DOUBLE DATA-RATE MEMORY DEVICE INTERFACE

BACKGROUND

As computers and computer processors increase in performance, memory access performance becomes a significant factor affecting overall system performance. If an interface that communicates data between a memory device and a memory controller or other application device operates more slowly than a processor can use data, the interface can reduce the data processing capacity of the entire computer. For dynamic random access memory (DRAM) devices, which are commonly used as the main working memory for a computer, various interconnect technologies have been developed over the years. One such interconnect technology is used for synchronous DRAMs, or SDRAMs, which utilize a source synchronous interface, where the source of data during a data transfer is relied upon to provide a data strobe signal (DQS) that is used by the target of the data transfer to capture such data as it is being transferred over a data line to the target. In particular, the capture of data on a data line is typically latched by the rising or falling edge of the DQS signals, for example, so that the value transmitted on a data line when the data strobe signal transitions from low to high, or vice-versa, will be latched into a data latch in the target.

DRAM memory elements, such as double data rate (DDR) memory elements, contain multiple buses. A command and address bus is formed by a number of signals, such as, for example, a column-address strobe (CAS), row-address strobe (RAS), write enable (WE), clock enable (CKE), chip-select (CS), address (ADDR), bank address (BA) signals, and differential clock signals (CK and CKN). DDR3 memory elements operate with differential data strobe signals DQS and DQSN, which enable source synchronous data capture at twice the clock frequency. The data bus contains the data signals (DQ), and the source synchronous data strobe signals. Data is registered with the rising edges of both DQS and DQSN.

DDR3 data is transferred in bursts for both read and write operations, sending or receiving a series of four (referred to as burst chop 4 or BC4) or eight (referred to as burst length 8 or BL8) data words with each memory access. For read operations, data bursts of various lengths are transmitted by the DRAM device edge-aligned with a data strobe signal. For write operations, data bursts of various lengths are received by the DRAM element with a 90-degree phase-delayed data strobe signal. The data strobe signal is a bidirectional signal used to capture data. After the data is captured in the source-synchronous data strobe domain, the data must be transferred into a local clock domain.

For dual in-line memory modules or DIMMs, the DDR3 memory specification includes what is commonly known as a "flyby" topology for clock, address and control connections that are shared between all of the DRAM devices on the DIMM. As opposed to the balanced tree arrangement used in DDR2 memory, which provides clock, address and control signal lines of approximately the same length to each memory element in a memory module at the expense of signal integrity, the flyby topology is arranged to promote signal integrity and results in clock, address and control signal lines of different lengths for each device within the module. Consequently, the timing relationships between the data, data strobe and clock signals can vary undesirably from one memory element in the DIMM to another. In some instances, the difference between the lengths of two DQS lines relative to a common clock signal line may be more than a single clock period. Since the DDR3 SDRAM devices require a specific timing relationship between the data, data strobe and clock at the respective DRAM pins, the DDR3 specification supports an independent timing calibration procedure known as "write leveling" or "write level training" for each source synchronous group.

Write leveling allows the host logic circuitry that initiates the data transfers (e.g., a core logic portion of an ASIC) to configure the interface that communicates data between the memory controller and the target DRAM to delay the data strobe signal and data signals by a configurable or controllable amount of time. A free-running clock signal (CK) is propagated from the host logic circuitry to an input of a dedicated internal calibration register in a target DRAM. In the write leveling procedure, a single data strobe signal (DQS) pulse is propagated from the host logic circuitry to the dedicated internal calibration register in the DRAM. In response to this single DQS signal pulse, the dedicated internal calibration register outputs a signal that indicates the phase alignment between the clock signal and the data strobe signal rising edge at the DQ pin of the DRAM. This output is propagated back to the host on one or more of the data signal (DQ) lines to the memory controller. The calibration is repeated with different delay values until an optimum write leveling delay is determined. The host logic circuitry can then configure the interface to use the optimized write leveling delay for subsequent write operations from the memory controller to the target DRAM.

The value of the optimum write leveling delay is determined in the manner described above for each source synchronous group. However, in an instance in which the write-leveling logic is capable of delaying the data strobe signal by as much as two full clock cycles, it cannot be determined by examining the optimum write leveling delay value alone whether, during a write operation initiated by the host logic circuitry, the data strobe signal of each source synchronous group will be aligned with the same rising edge of the clock signal as the data strobe signals of other source synchronous groups. That is, it cannot be determined from examining the write leveling delay value alone whether applying the write leveling delay to the data strobe signal would align the data strobe signal with the first rising edge of the clock signal following that data strobe signal or the second rising edge of the clock signal following that data strobe signal. For correct operation, the data strobe signals of all source synchronous groups must be aligned to the same edge of the clock signal relative to the initiation of those data strobe signals.

In an instance in which the write-leveling logic is capable of delaying the data strobe signal by as much as two full clock cycles, it is desirable to determine to which of the two rising clock cycle edges each data strobe signal would be aligned as a result of applying the write leveling delay determined by the write-leveling procedure. If the results of the write leveling procedure indicate that the write leveling delay to be applied to the data strobe signal of one source synchronous group would align that data strobe signal with the first rising edge of the clock signal but indicates that the write leveling delay to be applied to the data strobe signal of another source synchronous group would align that data strobe signal with the second rising edge of the clock signal, then the write-leveling logic can adjust (i.e., advance or retard) one of the two write leveling delays by one clock cycle, so that both data strobe signals are aligned with the same edge of the clock signal.

A prior method for determining to which of the two rising clock cycle edges each data strobe signal is aligned following write leveling involved a system designer using a priori knowledge of the relative routing of the data strobe signals and clock signals to the various source synchronous groups and guessing to which of the two successive clock cycle edges the data strobe signal is more likely aligned. Write-read-compare operations were then performed to verify that the correct clock signal edge had been identified, and adjustments were made in a trial-and-error manner until error-free results in the write-read-compare operations indicated that data strobe signals of all source synchronous groups had been aligned with the same clock edge. It would be desirable to provide a more efficient and deterministic method and system for identifying to which of two rising clock cycle edges each data strobe signal is aligned following write leveling.

SUMMARY

Embodiments of the invention relate to a write leveling calibration system and method in a dynamic random access memory (DRAM) interface. In exemplary embodiments, the method comprises: setting a clock signal in the interface to a first frequency; performing a first write leveling method in the interface while the clock signal is set to the first frequency to obtain a first write leveling value; setting the clock signal in the interface to a second frequency, wherein one of the first frequency and the second frequency is an integer multiple of the other of the first frequency and the second frequency; performing a second write leveling method in the interface while the clock signal is set to the second frequency to obtain a second write leveling value; determining a first calculated value in response to the first write leveling value and the second write leveling value; determining a number of clock cycles of offset in response to the first calculated value; setting a write leveling value in the interface to one of the first write leveling value and the second write leveling value plus the number of clock cycles of offset; and setting the clock signal in the interface to one of the first frequency and the second frequency corresponding to the one of the first write leveling value and the second write leveling value.

In exemplary embodiments, the system includes a DRAM interface having at least one source synchronous group configured to effect write operations and read operations with the dynamic random access memory. Each source synchronous group includes write leveling logic. The system also includes control logic that is programmed or configured to effect the steps of: setting a clock signal in the interface to a first frequency; performing a first write leveling method in the interface while the clock signal is set to the first frequency to obtain a first write leveling value; setting the clock signal in the interface to a second frequency, wherein one of the first frequency and the second frequency is an integer multiple of the other of the first frequency and the second frequency; performing a second write leveling method in the interface while the clock signal is set to the second frequency to obtain a second write leveling value; determining a first calculated value in response to the first write leveling value and the second write leveling value; determining a number of clock cycles of offset in response to the first calculated value; setting a write leveling value in at least one of the source synchronous groups of the interface to one of the first write leveling value and the second write leveling value plus the number of clock cycles of offset; and setting the clock signal in the interface to one of the first frequency and the second frequency corresponding to the one of the first write leveling value and the second write leveling value.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

FIG. 2A is a timing diagram illustrating an exemplary instance of write operation timing before write leveling.

FIG. 2B is similar to FIG. 2A, showing the results of write leveling.

FIG. 3A is a timing diagram illustrating another exemplary instance of write operation timing before write leveling.

FIG. 3B is similar to FIG. 3A, showing the results of write leveling.

DETAILED DESCRIPTION

Figure 1:
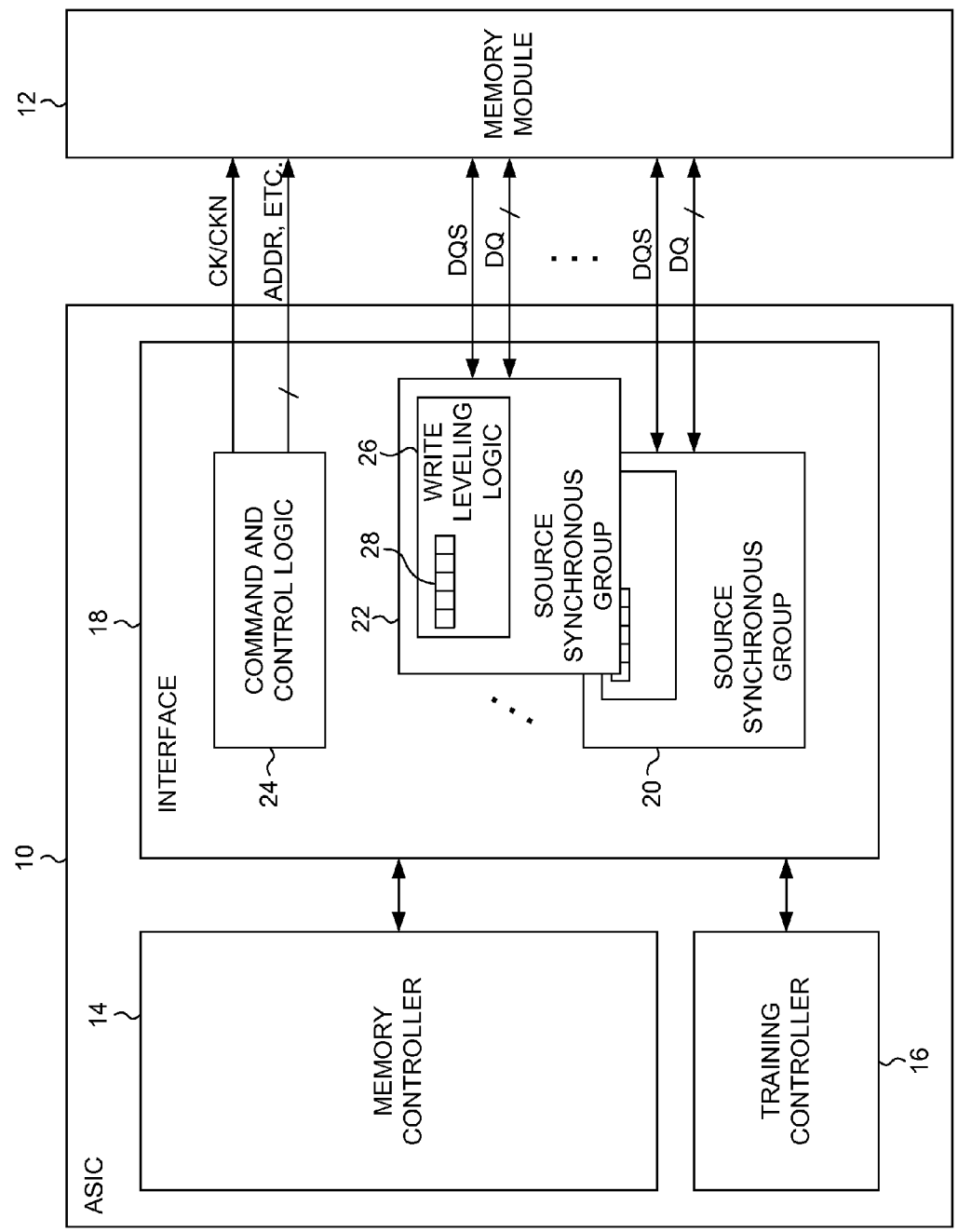
FIG. 1 is a block diagram of an application-specific integrated circuit (ASIC) having a calibration or training controller system for controlling a write leveling training or calibration procedure in a dynamic random access memory (DRAM) interface, in accordance with an exemplary embodiment of the invention.

As illustrated in FIG. 1, in an illustrative or exemplary embodiment of the invention, an application-specific integrated circuit (ASIC) 10 is interfaced with a double data rate (DDR) dynamic random access memory (DRAM) 12. DRAM 12 can comprise any suitable type of commercially available DDR3 or similar DRAM (or DRAM module). The ASIC 10 includes, among other elements (not shown for purposes of clarity), a memory controller 14, a training controller 16, and an interface 18. As the structure and operation of interface 18 conform to the specifications published by the DRAM manufacturer, providing a suitable interface 18 is well within the capabilities of one of ordinary skill in the art. Accordingly, details of interface 18 are not described herein. Rather, for purposes of the exemplary embodiment described herein, it is sufficient to note that interface 18 includes a number of (e.g., typically two or more) source-synchronous groups 20, 22, etc., and command and control logic 24. Each source-synchronous group 20, 22, etc. communicates a group of bidirectional data signals (DQ) and a bidirectional data strobe signal (DQS) with DRAM 12. In the exemplary embodiment, each group of data signals consists of eight signal lines, such that data can be communicated between each source-synchronous group 20, 22, etc., and DRAM module 12 in the form of 8-bit words. In the exemplary embodiment, read and write operations are performed in bursts of, for example, eight such 8-bit words, provided sequentially and communicated between one of the source-synchronous groups 20, 22, etc., and DRAM 12. Nevertheless, in other embodiments such read and write operations can be performed using any number of bursts of any valid length, and for any number of source synchronous groups.

In response to a write command received from memory controller 14, interface 18 provides data signals that represent a burst of data to be written to DRAM 12 and generates a data strobe signal having the required timing relationship (i.e., phase alignment) to the data signals. In response to a read command received from memory controller 14, interface 18 receives data signals and a strobe signal from memory module 12.

Each source-synchronous group 20, 22, etc., also includes conventional write leveling logic 26 that can ensure the data strobe signal is phase-aligned with the rising edge of the clock signal (CK) at the input pins to DRAM 12 during a write operation. Write leveling logic 26 includes a register 28 in which can be stored a binary number that indicates a write leveling delay that write leveling logic 26 is to apply to the data strobe signal. The binary number represents the write leveling delay in units of a fractional clock cycle. For example, the fractional clock cycle can be 1/16 of a clock cycle, such that a whole clock cycle consists of 16 fractional clock cycles. Although in the exemplary embodiment each clock cycle is divided into 16 fractional clock cycles, in other embodiments each clock cycle can be divided into any number of fractional clock cycles. In response to the binary number stored in register 28, write leveling logic 26 delays the data strobe signal by an amount of time corresponding to the number of fractional clock cycles. In the exemplary embodiment, write leveling logic 26 is capable of delaying the data strobe signal by as much as essentially two full clock cycles. Therefore, register 28 is capable of storing a 5-bit number (write leveling delay value) that represents the number of fractional clock cycles by which to delay the data strobe signal within a span or range of two clock cycles. Nevertheless, in other embodiments such write leveling logic may be capable of delaying the data strobe signal by more than two clock cycles. Since in other embodiments each clock cycle can consist of any number of fractional clock cycles, in such other embodiments the binary number that represents the number of fractional clock cycles by which to delay the data strobe signal can have any number of bits.

It should be understood that although for purposes of clarity only the operation of one of source synchronous groups 20, 22, etc. is described above, each of source synchronous groups 20, 22, etc. operates in the same manner. Thus, write leveling logic 26 of each of source synchronous groups 20, 22, etc. delays the data strobe signal of that source synchronous group 20, 22, etc. by an amount of time corresponding to the write leveling delay value stored in register 28 of that source synchronous group 20, 22, etc.

Training controller 16 is configured to perform or control, among other things, conventional write leveling training. As well understood by persons skilled in the art, a conventional write leveling method involves write leveling logic 26 issuing a single data strobe signal pulse that propagates to a dedicated internal calibration register (not shown for purposes of clarity) in DRAM 12. Write leveling logic 26 delays this data strobe signal pulse by an amount of time corresponding to the write leveling delay value that training controller 16 has caused to be stored in register 28. In response to this single data strobe signal pulse, the dedicated internal calibration register in DRAM 12 outputs a signal that indicates the phase alignment between the clock signal and the data strobe signal rising edge at the data pin of DRAM 12. This phase alignment indication is propagated back to write leveling logic 26 on one or more of the data signal (DQ) lines. Training controller 16 can then read this phase alignment indication obtained by write leveling logic 26. The steps of write leveling logic 26 issuing a single data strobe signal pulse, receiving a phase alignment indication, and providing the phase alignment indication to training controller 16 can be repeated multiple times, each time with a different write leveling delay value provided by training controller 16, until training controller 16 has determined an optimum write leveling delay value. The above-described write leveling procedure or method is well known in the art and therefore not described in further detail.

Two exemplary instances of the above-described write leveling procedure are illustrated in FIGS. 2A-B and 3A-B, respectively. As illustrated in FIG. 2A, following the initiation of a write operation by memory controller 14, a first rising edge (EDGE_0) of the clock signal (CK) is present in an exemplary one of source synchronous groups 20, 22, etc. (which can be referred to for convenience as source synchronous group "X") of interface 18 at a time 30, and a second rising edge (EDGE_1) of the clock signal (CK) is present in source synchronous group X at a time 32. Note that the first rising edge of the clock signal is "first" in the sense that it occurs just before (or, in other instances, just after) that data strobe signal (DQS) and occurs a fixed or predetermined number of clock cycles after memory controller 14 initiates the write operation. The second rising edge of the clock signal is that which immediately follows the first rising edge of the clock signal. As further shown in FIG. 2A, following the initiation of a write operation by memory controller 14, a data strobe signal (DQS[X]) is present at the output of source synchronous group X at a time 34. Due to propagation delay in the clock signal routing, the first rising edge (EDGE_0) of the clock signal (CK) does not reach the portion of DRAM 12 interfaced with source synchronous group X until a time 36, and the second rising edge (EDGE_1) of the clock signal (CK) does not reach this portion of DRAM 12 until a time 38. Prior to write leveling, the rising edge of the data strobe signal issued by source synchronous group X at a time 34 does not reach the input of DRAM 12 until a time 40. As this rising edge of the data strobe signal at time 40 is not phase aligned, i.e., does not occur at the same time as, any rising edge of the clock signal, write leveling can be used to remedy the lack of such phase alignment.

As illustrated in FIG. 2B, the above-described conventional write leveling procedure can be performed to determine the write leveling delay (T_WLX) that, when applied to the data strobe signal by source synchronous group X, phase aligns the rising edge of the data strobe signal with a rising edge of the clock signal at time 38. It should be noted, however, that the above-described conventional write leveling procedure results in training controller 16 determining a write leveling delay value that is some fraction of one clock cycle. In an embodiment in which a clock cycle is divided into 16 fractional units, the above-described conventional write leveling procedure results in training controller 16 determining a 4-bit write leveling value.

As illustrated in FIG. 3A, following the initiation of the write operation by memory controller 14, the first rising edge (EDGE_0) of the clock signal (CK) is present in another exemplary one of source synchronous groups 20, 22, etc. (which can be referred to for convenience as source synchronous group "Y") of interface 18 at time 30, and the second rising edge (EDGE_1) of the clock signal (CK) is present in source synchronous group Y at time 32, just as in source synchronous group X (FIG. 2A). A data strobe signal (DQS[Y]) is present at the output of source synchronous group Y at a time 34, just as such a data strobe signal is present at the output of source synchronous group X at time 34 (FIG. 2A). Due to propagation delay in the clock signal routing, the first rising edge (EDGE_0) of the clock signal (CK) does not reach the portion of DRAM 12 interfaced with source synchronous group Y until a time 42, and the second rising edge (EDGE_1) of the clock signal (CK) does not reach this portion of DRAM 12 until a time 44. Prior to write leveling, the rising edge of the data strobe signal issued by source synchronous group Y at a time 34 does not reach the input of DRAM 12 until a time 46. As this rising edge of the data strobe signal at time 46 is not phase aligned, i.e., does not occur at the same time as, any rising edge of the clock signal, write leveling can be used to remedy the lack of such phase alignment.

As illustrated in FIG. 3B, the above-described conventional write leveling procedure can be performed to determine the write leveling delay that, when applied to the data strobe signal by source synchronous group Y, phase aligns the rising edge of the data strobe signal with a rising edge of the clock signal. It should be noted, however, that the above-described conventional write leveling procedure results in training controller 16 determining a write leveling delay value that is some fraction of one clock cycle. In an embodiment in which a clock cycle is divided into 16 fractional units, the above-described conventional write leveling procedure results in training controller 16 determining a 4-bit write leveling value. Therefore, the write leveling value determined by training controller 16 may represent a delay 48 (T_WLY) that, if applied to the data strobe signal by source synchronous group Y, would phase align the rising edge of the data strobe signal with the first rising edge of the clock signal at time 42. However, as it is generally necessary for the data strobe signals of all source synchronous groups to be phase aligned with the same relative rising edge of the clock signal, either the rising edges of the data strobe signals of source synchronous groups X and Y (as well as the others that are not shown for purposes of clarity) all should be aligned with the first rising edge of the clock signal or the rising edges of the data strobe signals of source synchronous groups X and Y (as well as the others that are not shown for purposes of clarity) all should be aligned with the second rising edge of the clock signal. In the exemplary instance shown in FIG. 3B, the data strobe signal of source synchronous group Y can be aligned with the same rising edge of the clock signal as the data strobe signal of source synchronous group X, i.e., the second rising edge of the clock signal at time 44, by delaying the data strobe signal of source synchronous group Y by a delay T_WLY' instead of T_WLY. Note that the delay T_WLY' is offset from (i.e., exactly one clock cycle greater than) the delay 48 (T_WLY). As each source synchronous group 20, 22, etc. is capable of delaying its data strobe signal by as much as essentially two full clock cycles in response to a 5-bit write leveling delay value representing up to 31 fractional clock cycles of delay, the most-significant bit of the 5-bit write leveling delay value represents the number of whole clock cycles of offset to be added to the conventionally-determined 4-bit write leveling delay value. The method described below can be embodied in training controller 16 to determine the value (i.e., logic-0 or logic-1) to assign to the most-significant bit of the 5-bit write leveling delay value to be stored in register 28 of each source synchronous group 20, 22, etc.

Figure 4:
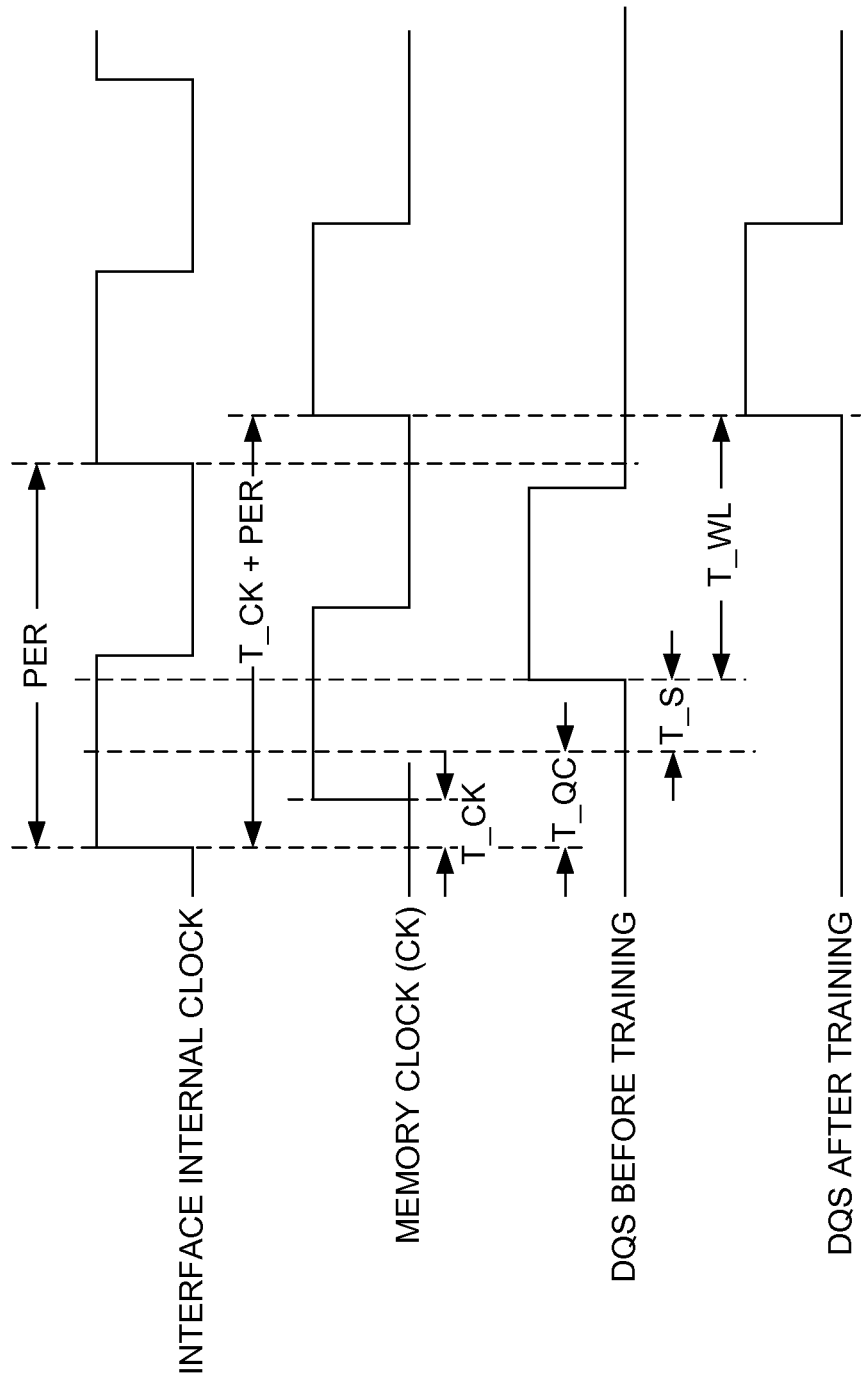
FIG. 4 is a timing diagram illustrating timing relationships among signals relevant to write leveling.

The basis for the method can be appreciated with reference to the timing diagram of FIG. 4 and related equations. In FIG. 4: the delay of the clock signal between interface 18 and the portion of DRAM 12 with which a source synchronous group 20, 22, etc. interfaces is labeled T_CK; the delay of the data strobe signal between interface 18 and the portion of DRAM 12 with which that source synchronous group 20, 22, etc. interfaces is labeled T_S; the so-called "quarter-cycle delay" that interface 18 internally adds to each data strobe signal is labeled T_QC; and the optimal write leveling delay that each source synchronous group 20, 22, etc. adds to the data strobe signal as a result of write leveling is labeled T_WL. Note that:

$$T\_QC = QC*PER/M, \quad (Eq.\ 1)$$

where QC represents the number of fractional clock cycles in one-quarter of a clock cycle, PER represents the period of one clock cycle, and M represents the number of fractional clock cycles per whole clock cycle. In the exemplary embodiment, QC=4, and M=16. Also note that:

Also note that:

$$T\_WL = MSB*PER + WL*PER/16, \quad (Eq.\ 2)$$

where MSB represents the most-significant bit of the 5-bit write leveling delay value, and WL represents the optimal 4-bit write leveling value that can be determined by the above-described conventional write leveling procedure. It can further be noted that, when the optimal write leveling delay T_WL is added to the data strobe signal:

$$PER + T\_CK = T\_QC + T\_S + T\_WL. \quad (Eq.\ 3)$$

The equivalent expressions for T_QC and T_WL from Equations 1 and 2 can be substituted for T_QC and T_WL in Equation 3. Also, as T_CK and T_S are fixed values, Equation 3 can be rearranged to place these values on the left side of the equation:

$$16(T\_CK - T\_S) = PER(QC + 16*MSB + WL - 16), \quad (Eq.\ 4)$$

It has been recognized in accordance with the present invention that Equation 4 will hold true for optimal write level values obtained for any valid operating frequency. Consider, for example, a method in which a first conventional write leveling procedure is performed while the clock signal has a first frequency (and thus a first period) and then a second write leveling procedure is performed again while the clock signal has a second frequency (and thus a second period), where the second period is an integer multiple (I) of the first period, and I is greater than or equal to two. (The first and second frequencies/periods must be different from each other.) For example, the second period can be twice the first period:

$$PER\_H = 2*PER\_N, \quad (Eq.\ 5)$$

where PER_H represents the period of a clock signal having the second frequency (and a greater period), and PER_N represents the period of a clock signal having the first frequency (and a lesser period). For purposes of illustration, PER_N can represent the period of clock signal having a "nominal" clock frequency at which it is desired to operate DRAM 12 in its normal operational mode following the training or calibration described herein.

As the left side of Equation 4 comprises fixed values or constants, and in an instance in which the second period is twice the first period:

$$PER\_N(QC + 16*MSB\_N + WL\_N - 16) = 2*PER\_N \\ (QC + 16*MSB\_H + WL\_H - 16), \quad (Eq.\ 6)$$

where MSB_N represents the most-significant bit of the 5-bit write leveling delay value resulting from the write leveling procedure performed at the first clock frequency, WL_N represents the four less-significant or lower-order bits of the 5-bit write leveling delay value resulting from the write leveling procedure performed at the first clock frequency, MSB_H represents the most-significant bit of the 5-bit write leveling delay value resulting from the write leveling procedure performed at the second clock frequency, and WL_H represents the four less-significant or lower-order bits of the 5-bit write leveling delay value resulting from the write leveling procedure performed at the second clock frequency. Note that WL_N can be determined by performing the above-described conventional write leveling procedure with the clock signal set to the first frequency, and WL_H can be determined by performing the above-described conventional write leveling procedure with the clock signal set to the second frequency.

As the goal of the method is to determine at least MSB_N, Equation 6 can be rearranged to solve for MSB_N and MSB_H:

$$16(MSB\_N - 2*MSB\_H) = (QC-16) + (2*WL\_H - WL\_N) \quad \text{(Eq. 7)}$$

Figure 5:
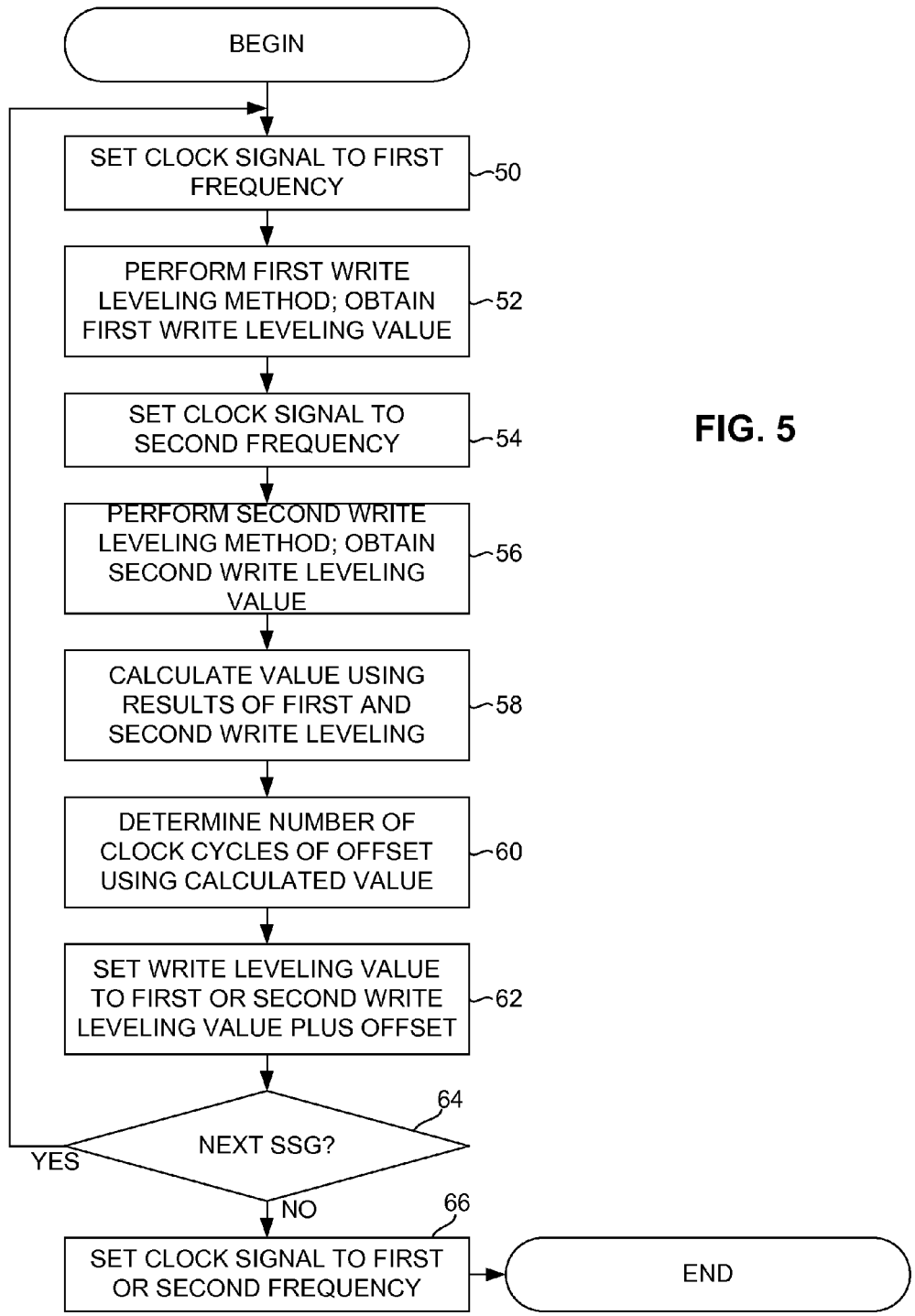
FIG. 5 is a flow diagram illustrating a write leveling calibration method, in accordance with an exemplary embodiment of the invention.

Note that in the exemplary embodiment there are only four possible combinations of MSB_N and MSB_H: 00, 01, 10 and 11. (However, in embodiments (not shown) in which write leveling logic is capable of delaying the data strobe signal by more than two clock cycles, a similar equation can be provided that accounts for multiple higher-order bits to indicate the number of clock cycles instead of a single most-significant bit.) Accordingly, the left side of equation 7 evaluates to one of four possible values: 0, −32, 16 and −16. Thus, MSB_N can be determined by calculating or evaluating the right side of Equation 7 and comparing the calculated value with each of the four values calculated or evaluated for the left side of Equation 7. The method is illustrated more fully by the flow diagram of FIG. 5. Persons skilled in the art are readily capable of programming or otherwise configuring training controller 16 to effect or control such a method. It should be noted that although in the exemplary embodiment training controller 16 is a separately identifiable element from memory controller 14, in other embodiments some or all of the functionality or logic of training controller 16 described herein can be included in a memory controller. That is, in other embodiments a memory controller or other control logic can be provided that includes the functionality or logic of both memory controller 14 and training controller 16.

As indicated by block 50, training controller 16 sets the clock signal in interface 18 to a first frequency. As indicated by block 52, training controller 16 then initiates the performance of a conventional write leveling method in one of source synchronous groups 20, 22, etc. in interface 18 (which for convenience can be referred to as the "nth" source synchronous group) while the clock signal remains set to the first frequency. As a result of this first performance of the conventional write leveling method, training controller 16 obtains a 4-bit write leveling value (WL_N) from write leveling logic 26 of the nth source synchronous group.

As indicated by block 54, training controller 16 sets the clock signal in interface 18 to a second frequency. As described above, in the exemplary embodiment the period of the clock signal at the second frequency is an integer multiple of the period of the clock signal at the first frequency. Nevertheless, in other embodiments the period of the clock signal at the first frequency can be an integer multiple of the period of the clock signal at the second frequency. (Note that any frequencies/periods are suitable, so long as they meet the specifications of DRAM 12.) As indicated by block 56, training controller 16 then initiates the performance of a conventional write leveling method in the nth source synchronous group while the clock signal remains set to the second frequency. As a result of this second performance of the conventional write leveling method, training controller 16 obtains a 4-bit write leveling value (WL_H) from write leveling logic 26 of the nth source synchronous group.

As indicated by block 58, training controller 16 then calculates or evaluates the right side of Equation 7 using the two write leveling values WL_N and WL_H. As indicated by block 60, training controller 16 can then determine MSB_N, which represents the number of clock cycles by which to offset or delay the data strobe signal of the nth source synchronous group, by comparing the calculated value (i.e., the right side of Equation 7) with each of the four values that the left side of Equation 7 can assume: 0, −32, 16 and −16. If the calculated value of the right side of Equation 7 is closer to 0 than it is to −32, 16 or −16, then MSB_N and MSB_H are 0 and 0, respectively. If the calculated value of the right side of Equation 7 is closer to −32 than it is to 0, 16 or −16, then MSB_N and MSB_H are 0 and 1, respectively. If the calculated value of the right side of Equation 7 is closer to 16 than it is to 0, −32 or −16, then MSB_N and MSB_H are 1 and 0, respectively. If the calculated value of the right side of Equation 7 is closer to −16 than it is to 0, −32 or 16, then MSB_N and MSB_H are 1 and 1, respectively. Note that due to system jitter, the right side of Equation 7 may not evaluate to exactly 0, −32, 16 or −16 but rather may evaluate to within +/−1 of these values.

Training controller 16 can form a 5-bit write leveling value using the 4-bit write leveling value WL_N as the lower order bits and MSB_N as the most-significant bit. The most-significant bit represents the number of whole clock cycles of offset or delay, while the four lower-order bits represent the number of fractional clock cycles of delay.

As indicated by block 62, training controller 16 then sets the write leveling value in the nth source synchronous group of interface 18 to this 5-bit value by causing it to be stored in register 28 of the nth source synchronous group. As indicated by block 64, training controller 16 determines whether the method described above with regard to blocks 50-62 has been performed for all source synchronous groups 20, 22, etc. If the method has not yet been performed for all source synchronous groups 20, 22, etc., then the method is performed in the same manner as described above with regard to blocks 50-62 for the next or (n+1)th source synchronous group. If it is determined at block 64 that the method described above with regard to blocks 50-62 has been performed for all source synchronous groups 20, 22, etc., then training controller 16 sets the clock signal in interface 18 to the normal operational or "nominal" frequency in preparation for normal operational mode or mission mode, as indicated by block 66. Although in the exemplary embodiment the nominal frequency is referred to as the first frequency, in other embodiments the nominal frequency can be the second frequency (i.e., an integer multiple of the first frequency).

It should be noted that the order in which blocks 50-66 are described or shown is for illustrative purposes only, and in other embodiments aspects of the method can be performed in any other suitable order. For example, in other embodiments write leveling first can be performed for all source synchronous groups after the clock signal has been set to the first frequency and then can be performed for all source synchronous groups after the clock signal has been set to the second frequency. Also, in other embodiments, aspects described above with regard to a single block can be performed separately from each other or in a less integrated manner. Likewise, in other embodiments aspects described above with regard to separate blocks can be performed together or in a more integrated manner with each other or with still other aspects.

It should be noted that the invention has been described with respect to illustrative embodiments for the purpose of describing the principles and concepts of the invention. The invention is not limited to these embodiments. As will be understood by those skilled in the art in view of the description being provided herein, many modifications may be made to the embodiments described herein without deviating from the goals of the invention, and all such modifications are within the scope of the invention.

What is claimed is:

1. A write leveling calibration method in a dynamic random access memory (DRAM) interface, comprising:

setting a clock signal in the interface to a first frequency, the clock signal at the first frequency having a first period;

performing a first write leveling method in the interface while the clock signal is set to the first frequency to obtain a first write leveling value;

setting the clock signal in the interface to a second frequency, the clock signal at the second frequency having a second period, wherein one of the first period and the second period is an integer multiple of the other of the first period and the second period;

performing a second write leveling method in the interface while the clock signal is set to the second frequency to obtain a second write leveling value;

determining a first calculated value in response to the first write leveling value and the second write leveling value;

determining a number of clock cycles of offset in response to the first calculated value;

setting a write leveling value in the interface to one of the first write leveling value and the second write leveling value plus the number of clock cycles of offset; and setting the clock signal in the interface to one of the first frequency and the second frequency corresponding to the one of the first write leveling value and the second write leveling value.

2. The method of claim 1, wherein:

the interface includes a plurality of source synchronous groups;

the first write leveling method and second write leveling method are performed for each source synchronous group of the interface;

the number of clock cycles of offset is determined for each source synchronous group of the interface; and a write leveling value is set in each source synchronous group to align a data strobe signal of each source synchronous group with the same relative clock edge following an initiation of a write operation.

3. The method of claim 1, wherein determining a first calculated value in response to the first write leveling value and the second write leveling value comprises determining the first calculated value in response to a difference between one of the first write leveling value and the second write leveling value and the integer multiple of the other of the first write leveling value and the second write leveling value.

4. The method of claim 1, wherein setting a write leveling value in the interface comprises setting an N-bit binary number representing a number of fractional clock cycles, where the most-significant bit of the binary number represents the number of clock cycles of offset, and the least-significant N−1 bits of the binary number represent one of the first write leveling value and the second write leveling value.

5. The method of claim 4, wherein determining a number of clock cycles of offset in response to the first calculated value comprises:

determining four second calculated values in response to four unique combinations of two bits;

comparing the first calculated value with each of the four second calculated values; and determining one of the four second calculated values closest to the first calculated value.

6. The method of claim 5, wherein determining four second calculated values in response to four unique combinations of two bits comprises evaluating the quantity $M(MSB\_N - I*MSB\_H)$, wherein $MSB\_N$ and $MSB\_H$ are the two bits, M is a number of fractional clock cycles in a clock cycle, each of the first write leveling value and the second write leveling value is in a range from zero to M fractional clock cycles, and I is the integer multiple.

7. The method of claim 6, wherein determining the first calculated value in response to the first write leveling value and the second write leveling value comprises evaluating the quantity $(QC-M)+(I*WL\_H-WL\_N)$, wherein $WL\_N$ is the first write leveling value and $WL\_H$ is the second write leveling value.

8. The method of claim 7, wherein M=16, N=5, and I=2.

9. A system, comprising:

a dynamic random access memory (DRAM) interface having at least one source synchronous group configured to effect write operations and read operations with a DRAM, each source synchronous group comprising write leveling logic; and control logic programmed or configured to effect the steps of:

setting a clock signal in the interface to a first frequency, the clock signal at the first frequency having a first period;

performing a first write leveling method in the interface while the clock signal is set to the first frequency to obtain a first write leveling value;

setting the clock signal in the interface to a second frequency, the clock signal at the second frequency having a second period, wherein one of the first period and the second period is an integer multiple of the other of the first period and the second period;

performing a second write leveling method in the interface while the clock signal is set to the second frequency to obtain a second write leveling value;

determining a first calculated value in response to the first write leveling value and the second write leveling value;

determining a number of clock cycles of offset in response to the first calculated value;

setting a write leveling value in at least one of the source synchronous groups of the interface to one of the first write leveling value and the second write leveling value plus the number of clock cycles of offset; and setting the clock signal in the interface to one of the first frequency and the second frequency corresponding to the one of the first write leveling value and the second write leveling value.

10. The system of claim 9, wherein the interface has a plurality of source synchronous groups and the control logic is programmed or configured to:

perform the first write leveling method and second write leveling method for each source synchronous group of the interface;

determine the number of clock cycles of offset for each source synchronous group of the interface; and set a write leveling value in each source synchronous group to align a data strobe signal of each source synchronous group with the same relative clock edge following an initiation of a write operation.

11. The system of claim 9, wherein the control logic is programmed or configured to determine a first calculated value in response to the first write leveling value and the second write leveling value by determining the first calculated value in response to a difference between one of the first write leveling value and the second write leveling value and the integer multiple of the other of the first write leveling value and the second write leveling value.

12. The system of claim 9, wherein the control logic is programmed or configured to set a write leveling value by setting an N-bit binary number representing a number of fractional clock cycles, where the most-significant bit of the binary number represents the number of clock cycles of offset, and the least-significant N−1 bits of the binary number represent one of the first write leveling value and the second write leveling value.

13. The system of claim 12, wherein the control logic is programmed or configured to determine a number of clock cycles of offset in response to the first calculated value by:
    determining four second calculated values in response to four unique combinations of two bits;
    comparing the first calculated value with each of the four second calculated values; and
    determining one of the four second calculated values closest to the first calculated value.

14. The system of claim 13, wherein the control logic is programmed or configured to determine four second calculated values in response to four unique combinations of two bits by evaluating the quantity $M(MSB\_N-I*MSB\_H)$, wherein $MSB\_N$ and $MSB\_H$ are the two bits, M is a number of fractional clock cycles in a clock cycle, each of the first write leveling value and the second write leveling value is in a range from zero to M fractional clock cycles, and I is the integer multiple.

15. The system of claim 14, wherein the control logic is programmed or configured to determine the first calculated value in response to the first write leveling value and the second write leveling value by evaluating the quantity $(QC-M)+(I*WL\_H-WL\_N)$, wherein $WL\_N$ is the first write leveling value and $WL\_H$ is the second write leveling value.

16. The system of claim 15, wherein M=16, N=5, and I=2.

17. An integrated circuit chip having a dynamic random access memory (DRAM) interface with a write leveling calibration system, comprising:
    at least one source synchronous group configured to effect write operations and read operations with the dynamic random access memory, the source synchronous group comprising write leveling logic; and
    control logic programmed or configured to effect the steps of:
    setting a clock signal in the interface to a first frequency;
    performing a first write leveling method in the interface while the clock signal is set to the first frequency to obtain a first write leveling value;
    setting the clock signal in the interface to a second frequency, wherein one of the first frequency and the second frequency is an integer multiple of the other of the first frequency and the second frequency;
    performing a second write leveling method in the interface while the clock signal is set to the second frequency to obtain a second write leveling value;
    determining a first calculated value in response to the first write leveling value and the second write leveling value;
    determining a number of clock cycles of offset in response to the first calculated value;
    setting a write leveling value in a source synchronous group of the interface to one of the first write leveling value and the second write leveling value plus the number of clock cycles of offset; and
    setting the clock signal in the interface to one of the first frequency and the second frequency corresponding to the one of the first write leveling value and the second write leveling value.

18. The integrated circuit chip of claim 17, wherein the interface has a plurality of source synchronous groups and the control logic is programmed or configured to:
    perform the first write leveling method and second write leveling method for each source synchronous group of the interface;
    determine the number of clock cycles of offset for each source synchronous group of the interface; and
    set a write leveling value in each source synchronous group to align a data strobe signal of each source synchronous group with the same relative clock edge following an initiation of a write operation.

19. The integrated circuit chip of claim 17, wherein the control logic is programmed or configured to determine a first calculated value in response to the first write leveling value and the second write leveling value by determining the first calculated value in response to a difference between one of the first write leveling value and the second write leveling value and the integer multiple of the other of the first write leveling value and the second write leveling value.

20. The integrated circuit chip of claim 9, wherein the control logic is programmed or configured to set a write leveling value by setting an N-bit binary number representing a number of fractional clock cycles, where the most-significant bit of the binary number represents the number of clock cycles of offset, and the least-significant N−1 bits of the binary number represent one of the first write leveling value and the second write leveling value.

* * * * *